(12) United States Patent
Seo et al.

(10) Patent No.: US 9,223,694 B2
(45) Date of Patent: *Dec. 29, 2015

(54) DATA STORAGE DEVICE AND OPERATING METHOD THEREOF

(71) Applicants: SK HYNIX INC., Icheon (KR); Industry-Academic Cooperation Foundation, Yonsei University, Seoul (KR)

(72) Inventors: Hyeok-Jun Seo, Seoul (KR); Seok-Min Ko, Seoul (KR); Eui-Young Chung, Gyeonggi-Do (KR)

(73) Assignees: SK HYNIX INC., Icheon (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 209 days.

This patent is subject to a terminal disclaimer.

(21) Appl. No.: 13/927,395

(22) Filed: Jun. 26, 2013

(65) Prior Publication Data

US 2014/0006694 A1 Jan. 2, 2014

(30) Foreign Application Priority Data

Jun. 29, 2012 (KR) .................. 10-2012-0070418

(51) Int. Cl.
*G06F 12/02* (2006.01)
(52) U.S. Cl.
CPC ........ *G06F 12/0246* (2013.01); *G06F 12/0253* (2013.01); *G06F 2212/7203* (2013.01); *G06F 2212/7205* (2013.01); *G06F 2212/7211* (2013.01)

(58) Field of Classification Search
None
See application file for complete search history.

(56) References Cited

U.S. PATENT DOCUMENTS

| | | | |
|---|---|---|---|
| 6,000,006 A * | 12/1999 | Bruce et al. ................... 711/103 |
| 2002/0126541 A1 * | 9/2002 | Spiegel et al. ........... 365/189.07 |
| 2009/0327591 A1 * | 12/2009 | Moshayedi ................... 711/103 |
| 2011/0252187 A1 * | 10/2011 | Segal et al. ................... 711/103 |
| 2011/0264843 A1 | 10/2011 | Haines et al. |
| 2013/0173844 A1 * | 7/2013 | Chen et al. ................... 711/103 |

FOREIGN PATENT DOCUMENTS

KR 10-2007-0008403 A 1/2007

OTHER PUBLICATIONS

Soojun Im et al., "ComboFTL: Improving performance and lifespan of MLC flash memory using SLC flash buffer,"Journal of Systems Architecture, Sep. 24, 2010, pp. 641-653, 56, Elsevier B.V.

* cited by examiner

*Primary Examiner* — Duc Doan

(57) ABSTRACT

A data storage device includes a first memory device configured to store data having a first property, and a second memory device including a first block configured to store data having a second property and a second block configured to store data transferred from the first memory device.

20 Claims, 13 Drawing Sheets

DATA STORAGE DEVICE AND OPERATING METHOD THEREOF

CROSS-REFERENCE TO RELATED APPLICATIONS

The present application claims priority of Korean Patent Application No. 10-2012-0070418, filed on Jun. 29, 2012, which is incorporated herein by reference in its entirety.

BACKGROUND

1. Field

Embodiments of the present invention relate to a data storage device and an operating method thereof, and more particularly, to a data storage device including two or more types of memory devices which classifies properties of data and selectively stores the data in the memory devices according to property, and a method of operating the same.

2. Description of the Related Art

Recently, much attention has been paid to a solid state drive (SSD) that includes a flash memory device as a data storage device to replace a hard disk drive.

Basically, a flash memory device cannot overwrite data. Therefore, in order to write new data at a physical location where data already exists, the existing data must be erased before the new data is written. In general, since a unit for a data erase operation (for example, a block including a plurality of pages) is larger than a unit for a data write operation (for example, a page), valid pages and invalid pages may coexist in one block. The valid pages represent pages storing valid data, and the invalid pages represent pages storing invalid data that is to be erased.

If the number of blocks including fewer valid pages than invalid pages increases, an available storage space of the flash memory device may decrease. Thus, in order to prevent such a problem, a garbage collection operation is performed on the blocks.

Flash memory devices include single-level-cell (SLC) memory devices and multi-level-cell (MLC) memory devices. An SLC memory device includes a plurality of SLCs each storing one bit, and an MLC memory device includes a plurality of MLCs each storing multiple bits. SLC memory devices have a higher operating speed than MLC memory devices, but have a higher price than MLC memory devices.

Therefore, there is a need for a data storage device that minimizes the disadvantages without compromising the advantages offered by both a high-speed memory device, such as an SLC memory device, and a high-capacity memory device, such as an MLC memory device.

SUMMARY

Various embodiments are directed to a data storage device including different types of memory devices and a method of operating the same.

In an embodiment, a data storage device includes: a first memory device configured to store data classified into data having a first property; and a second memory device including a first block configured to store data classified into data having a second property and a second block configured to store data transferred from the first memory device.

The data storage device may further include a request separator configured to classify data requested from outside into data having the first property or data having the second property.

The request separator may include: a first selection unit configured to classify the property of the data requested from outside into the first property or the second property according to the length of the data requested from outside; and a second selection unit configured to reclassify the data, of which the property is classified into the second property by the first selection unit, into data having the first property or data having the second property.

The second selection unit may include: a first storage device configured to sequentially store logical page addresses (LPAs) of the requested data according to a request sequence; and a second selection controller configured to reclassify data corresponding to a predetermined or more number of LPAs existing in the first storage device into data having the first property.

The data storage device may further include: a first buffer configured to temporarily store the data classified into data having the first property; and a second buffer configured to temporarily store data which is to be transferred from the first memory device to the second memory device.

The data storage device may further include a controller configured to select one or more data stored in the first memory device and transfer the selected data to the first or second memory device according to an update count (UC) of an address at which the data are stored.

The selected data may include one or more data including data used the longest time ago in the first memory device.

The controller may transfer data, of which a UC is less than a threshold value, to the second memory device.

The controller may store data, of which a UC is equal to or more than a threshold value, at a different position of the first memory device.

The data storage device may further include a controller configured to perform garbage collection for the second memory device.

The controller may store data, which is garbage-collected and transferred in the second memory device, in the second block.

The first memory device may include a memory device including single-level cells, and the second memory device includes a memory device including multi-level cells.

One or more of the first and second memory devices may include a nonvolatile memory device.

In an embodiment, an operating method of a data storage device includes: storing data classified into data having a first property in a first memory device; storing data classified into data having a second property in a first block of a second memory device; and storing data transferred from the first memory device in a second block of the second memory device.

The operating method may further include classifying the property of data requested from outside into the first property or the second property.

The classifying of the property of the data requested from outside may include: a first step of classifying the property of the data into the first property or the second property according to the length of the data requested from outside; and a second step of reclassifying the data, of which the property is classified into the second property at the first step, into the first property or the second property according to a request count of the data.

The second step may include: sequentially storing addresses of the requested data in a storage device having a constant length according to the request sequence; and reclassifying data, corresponding to a predetermined or more number of addresses existing in the storage device, into data having the first property.

The operating method may further include: selecting one or more data in the first memory device; and transferring the data to the second memory device which stores data having the second property, according to an UC corresponding to an address of the data.

The operating method may further include, when the UC corresponding to the address of the data exceeds a threshold value, storing the data in the first memory device again.

The operating method may further include resetting the UC corresponding to the address of the data stored again in the first memory device.

The operating method may further include, when new data is written at an address of valid data existing in the first memory device, increasing an UC corresponding to the address.

The selecting of the one or more data may include selecting one or more data including data used the longest time ago in the first memory device.

The operating method may further include performing garbage collection on the second memory device.

The performing of the garbage collection may include storing garbage-collected data in the second block of the second memory device.

DETAILED DESCRIPTION

Figure 1:
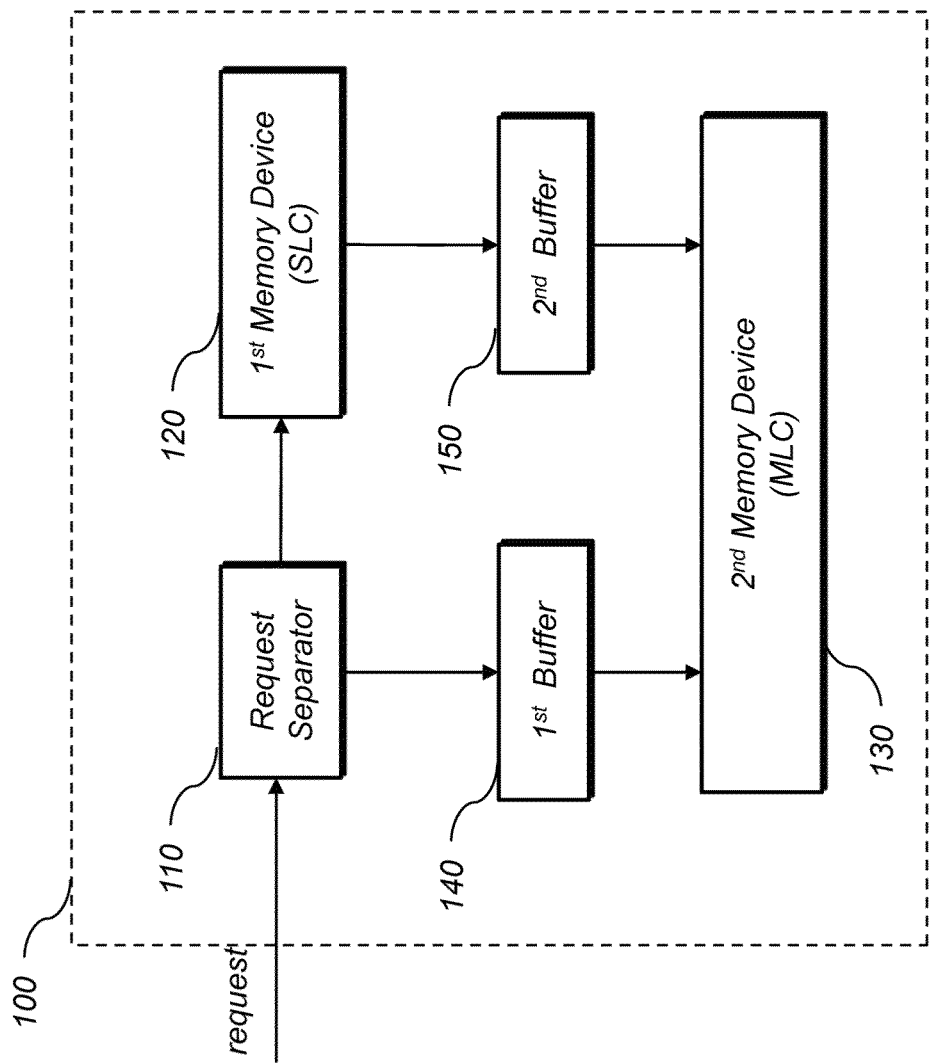
FIG. 1 is a block diagram illustrating a data storage device according to an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In general, a hot property of a logical address indicates that the logical address is requested more frequently, and a cold property indicates that the logical address is requested less frequently.

Hereafter, data stored at a logical address having a specific property may be referred to as data having the specific property. For example, data having a hot property indicates that a logical address at which the data is stored has the hot property.

In embodiments of the present invention, a logical page address is used as an example of a logical address. However, a unit of a logical address is not limited to a logical page address. Other units may be used depending on the applied mapping technology. As referred to herein, a logical page address represents an address designating a page.

FIG. 1 is a block diagram illustrating a data storage device 100 according to an embodiment of the present invention.

The data storage device 100 includes a request separator 110, a first memory device 120, and a second memory device 130. The request separator 110 selects one of the first and second memory devices 120 and 130 according to a property of data that is requested. The first memory device 120 stores data having a relatively hot property. The second memory device 130 stores data having a relatively cold property.

In an embodiment of the present invention, the first memory device 120 is implemented with an SLC memory device having a relatively high operating speed, and the second memory device 130 is implemented with an MLC memory device having a relatively large storage capacity.

The data storage device 100 further includes a first buffer 140 and a second buffer 150. The first buffer 140 temporarily stores data provided from the request separator 110 before the data is written into the second memory device 130. The second buffer 150 temporarily stores data transferred from the first memory device 120 before the data is written into the second memory device 130.

The data storage device 100 stores data having a relatively hot property in the first memory device 120. In an embodiment of the present invention, data not being longer than a predetermined length or accessed more frequently than a predetermined number of times is classified as data having a hot property, and data being longer than the predetermined length and accessed less frequently than a predetermined number of times is classified as data having a cold property.

If a property of data stored in the first memory device 120 is changed to a relatively cold property based on use, the first memory device 120 transfers the data to the second memory device 130.

The second memory device 130 stores both data provided from the request separator 110 (herein, also referred to as first data) and data provided from the first memory device 120 (herein, also referred to as second data). However, the two types of data are stored in different blocks. The second memory device 130 includes a first block, which stores the data provided from the request separator 110 (i.e., the first data), and a second block, which stores the data transferred from the first memory device 120 (i.e., the second data). The first and second blocks in the second memory device are distinct.

Such a configuration may improve the performance of the data storage device 100 including the first and second memory devices 120 and 130. This will be described below in more detail.

Figure 2A:
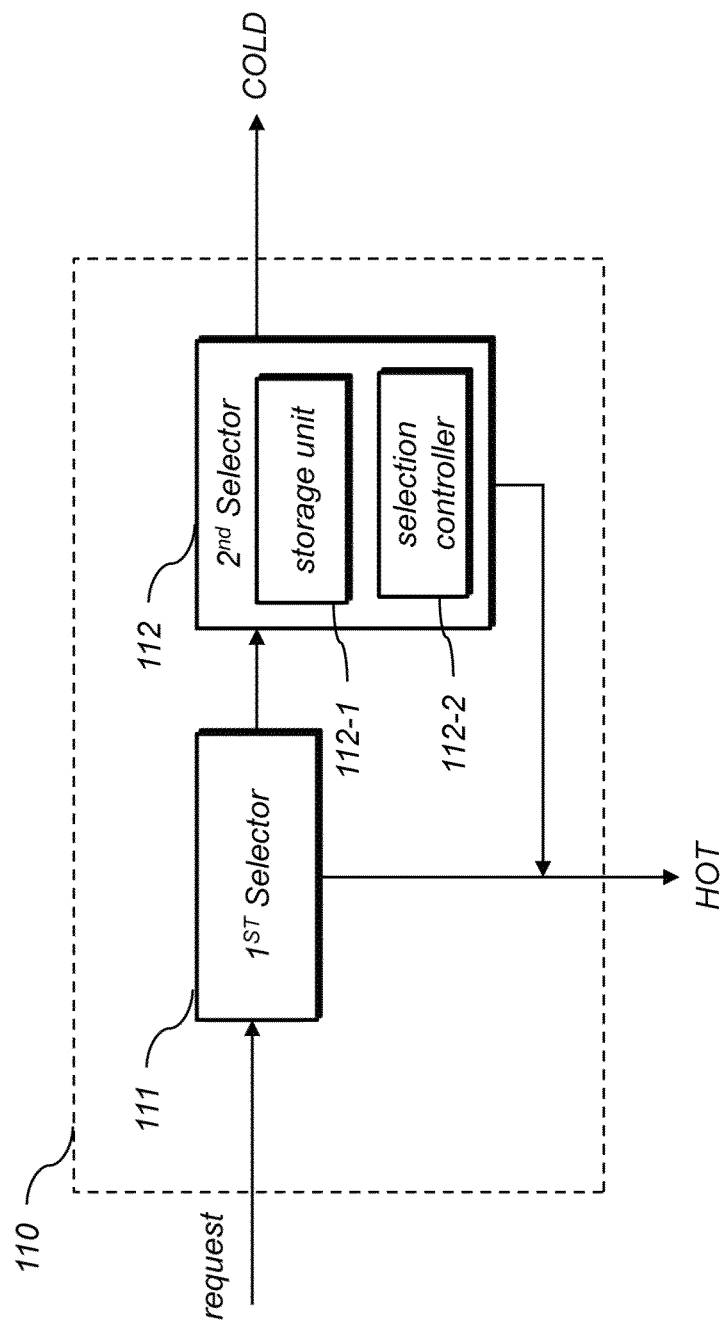
FIG. 2A illustrates a block diagram of a request separator of FIG. 1 according to an embodiment of the present invention.

FIG. 2A illustrates a block diagram of the request separator 110 according to an embodiment of the present invention. The request separator 110 includes first selector 111 and second selector 112. The first selector 111 classifies a property of data requested from outside into a hot property or a cold property according to a length of the data requested from outside. The second selector 112 reclassifies the data, which the first selector 111 had classified as having the cold property, as data having the hot property or data having the cold property according to a request count of the data. That is, the second selector 112 re-evaluates whether the data has a hot property or a cold property based on the number of times the data is accessed or requested.

The second selector 112 includes a storage unit 112-1 configured to sequentially store logical page addresses (LPAs) of the data requested from outside according to a request sequence. The second selector 112 also includes a selection controller 112-2 configured to reclassify data corresponding to a predetermined or more number of LPAs existing in the storage device into data having the hot property.

Figure 2B:
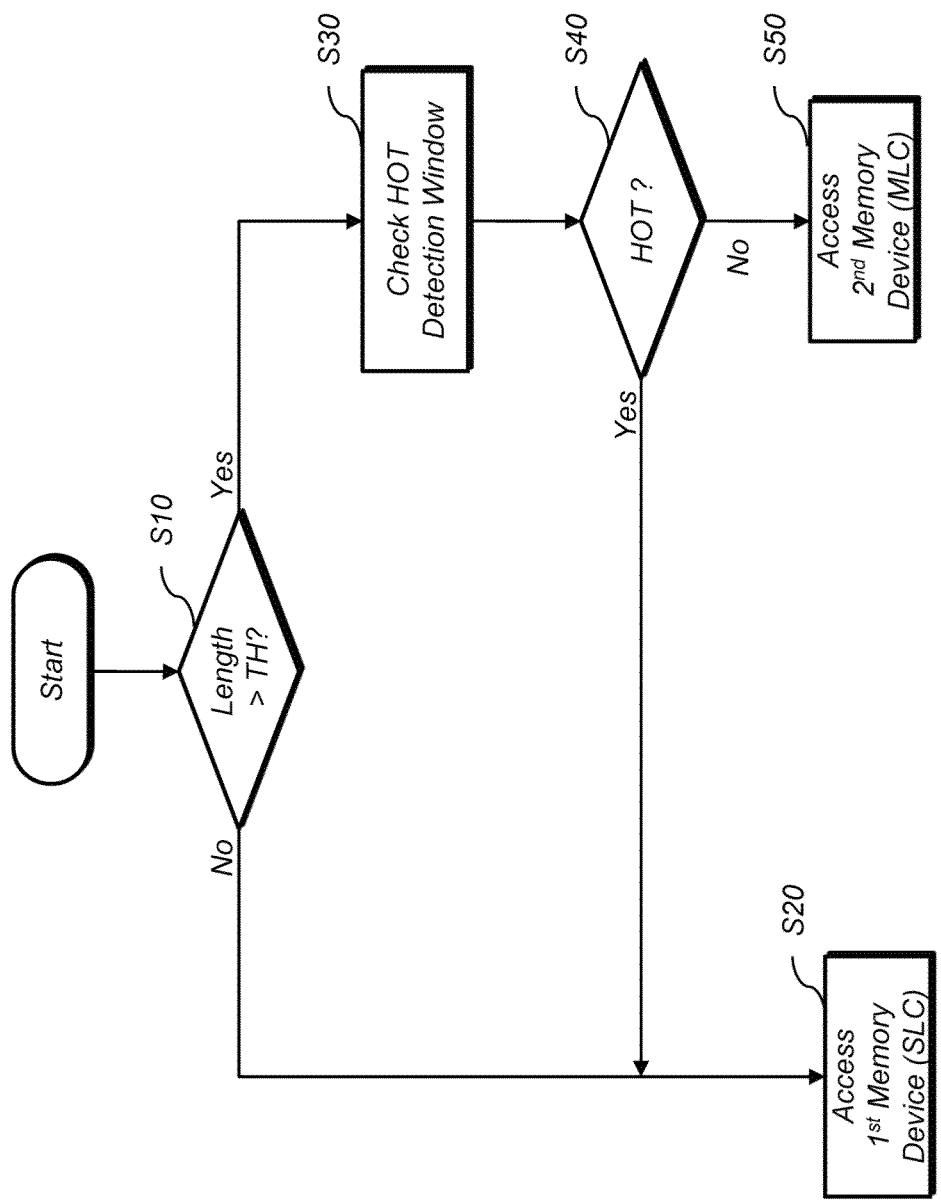
FIG. 2B is a flowchart illustrating an operating method of a request separator according to an embodiment of the present invention.

FIG. 2B is a flowchart illustrating an operating method of the request separator 110 according to an embodiment of the present invention The request separator 110 selects one of the first and second memory devices 120 and 130 to store data that is requested to be written into the data storage device 100.

If a data write request is made, the request separator 110 determines whether or not a length of the requested data exceeds a threshold value, at step S10.

If the length of the requested data is equal to or less than the threshold value, the request separator 110 determines that the requested data has a hot property, and stores the requested data in the first memory device 120, that is, an SLC memory device, at step S20.

On the other hand, if the requested data has a length greater than the threshold value, the requested data is initially classified as data having a relatively cold property. However, such data is subjected to a second classification process.

In accordance with an embodiment of the present invention, for performing the above operation, the storage unit 112-1 may have a queue structure with a predetermined length, and sequentially inputs requested data to a queue in the queue structure. The queue structure having the predetermined length may be referred to as a hot detection window.

The request separator 110 checks the queue at step S30. Then, the selection controller 112-2 compares a value associated with a number of times the data existing at a certain logical address within the queue is requested with a reference value, and determines again whether or not the certain logical address has a hot property, at step S40.

If the number of times is equal to or greater than the reference value, it means that access to the certain logical address occurs frequently. Thus, the frequently accessed data may be stored in the first memory device 120 having a relatively high operating speed in order to improve the performance of the data storage device 100.

In this way, the data determined to have a hot property is stored in the first memory device 120 at step S20, and other data having a cold property is stored in the second memory device 130 at step S50.

As described above, the request separator 110 selects one of the first and second memory devices 120 and 130 when data is initially input to the data storage device 100. For example, when a flash memory device, which has a unit for a data write operation (for example, a page) that is different from a unit for a data erase operation (for example, a block), is used, data cannot be overwritten, and thus physical locations of data may not be constantly maintained in the flash memory device. As a result, the property of the data determined when the data is initially stored may be changed over time.

Figure 3:
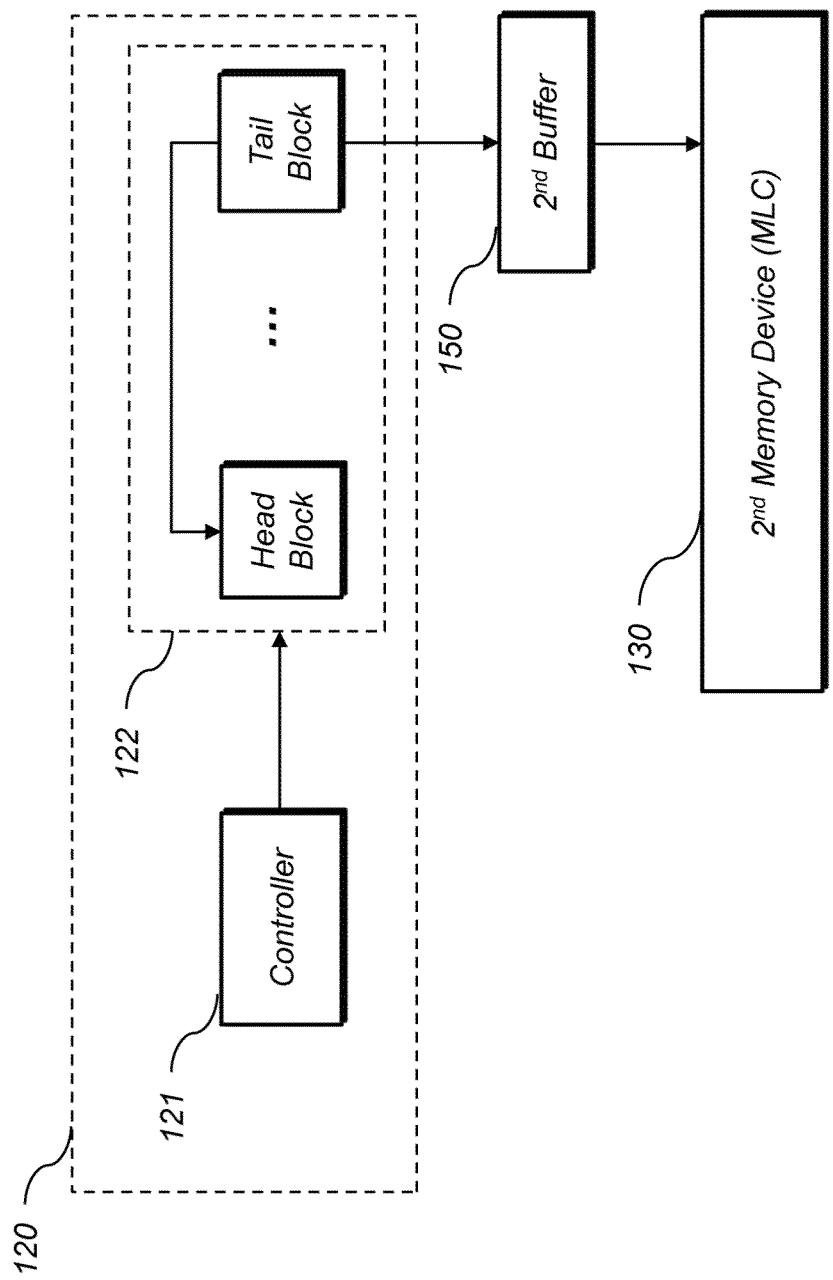
FIG. 3 is a block diagram illustrating a first memory device according to an embodiment of the present invention.

FIG. 3 is a block diagram illustrating the first memory device 120 according to an embodiment of the present invention.

The first memory device 120 includes a memory block 122 and a controller 121 configured to control an operation of the memory block 122.

The controller 121 controls a garbage collection operation of the first memory device 120. In an embodiment, the first memory device 120 operates according to a page level mapping method.

In an embodiment, the controller 121 is positioned in the first memory device 120. In another embodiment, the controller 121 may be provided outside the first memory device 120.

The memory block 122 includes a plurality of blocks including a head block and a tail block. Among the plurality of blocks, the block that has not been used for the longest time, is designated as the tail block, and a currently available block is designated as the head block. A data write operation is performed on the head block.

However, when the head block has no extra space such that the data write operation cannot be performed thereon any more, one of free blocks in the memory block 122 is designated as a new head block.

The controller 121 controls a garbage collection operation for the memory block 122. The controller 121 determines a property of data of a page during the garbage collection operation of the first memory device 120.

Data of a page determined to have a hot property is stored again in the head block of the first memory device 120, and data of a page determined to have a cold property is transferred to the second memory device 130. At this time, the data to be transferred to the second memory device 130 is temporarily stored in the second buffer 150.

In this embodiment, a property of a page is determined by considering an amount of time passing after data was written in the page and an update count of the page.

The garbage collection operation is performed on the tail block by considering the amount of time passing after data was written in the page.

In an embodiment, the tail block is a block including a page storing the oldest data, i.e., data that was written longer ago than data in any other block. The oldest block, i.e., the tail block, may have a higher number of invalidated pages than other blocks. Thus, when the garbage collection operation is performed on the tail block, the garbage collection cost may be reduced.

Furthermore, among valid pages of the tail block, a number of pages having a cold property may be higher than a number of pages having a hot property. Thus, it may be easier to filter pages having a relatively cold property in the first memory device 120.

In an embodiment, the garbage collection operation is performed only on the tail block. In another embodiment, however, the garbage collection operation may be performed on one or more blocks including the tail block.

In an embodiment, an update count (UC) for each logical page address (LPA) is determined to consider how many times a page was updated.

When data is initially written into a certain LPA, an UC corresponding to the LPA is reset to 0. Then, whenever a new data write request for the LPA is made, the UC is increased by one.

In order to determine if data has a hot or a cold property, a predetermined threshold UC value may be set. When the UC is higher, than the predetermined threshold UC value, it means that data of a corresponding LPA is frequently changed. Thus, the LPA is determined to have a hot property.

On the other hand, when the UC is lower than the predetermined threshold UC value, it means that data of the corresponding LPA is not changed frequently. Thus, the LPA is determined to have a cold property.

The tail block on which the garbage collection operation has been completely performed may be designated as a free block to write new data, and the block that has not been used for the longest time among other used blocks is designated as a new tail block.

Figure 4:
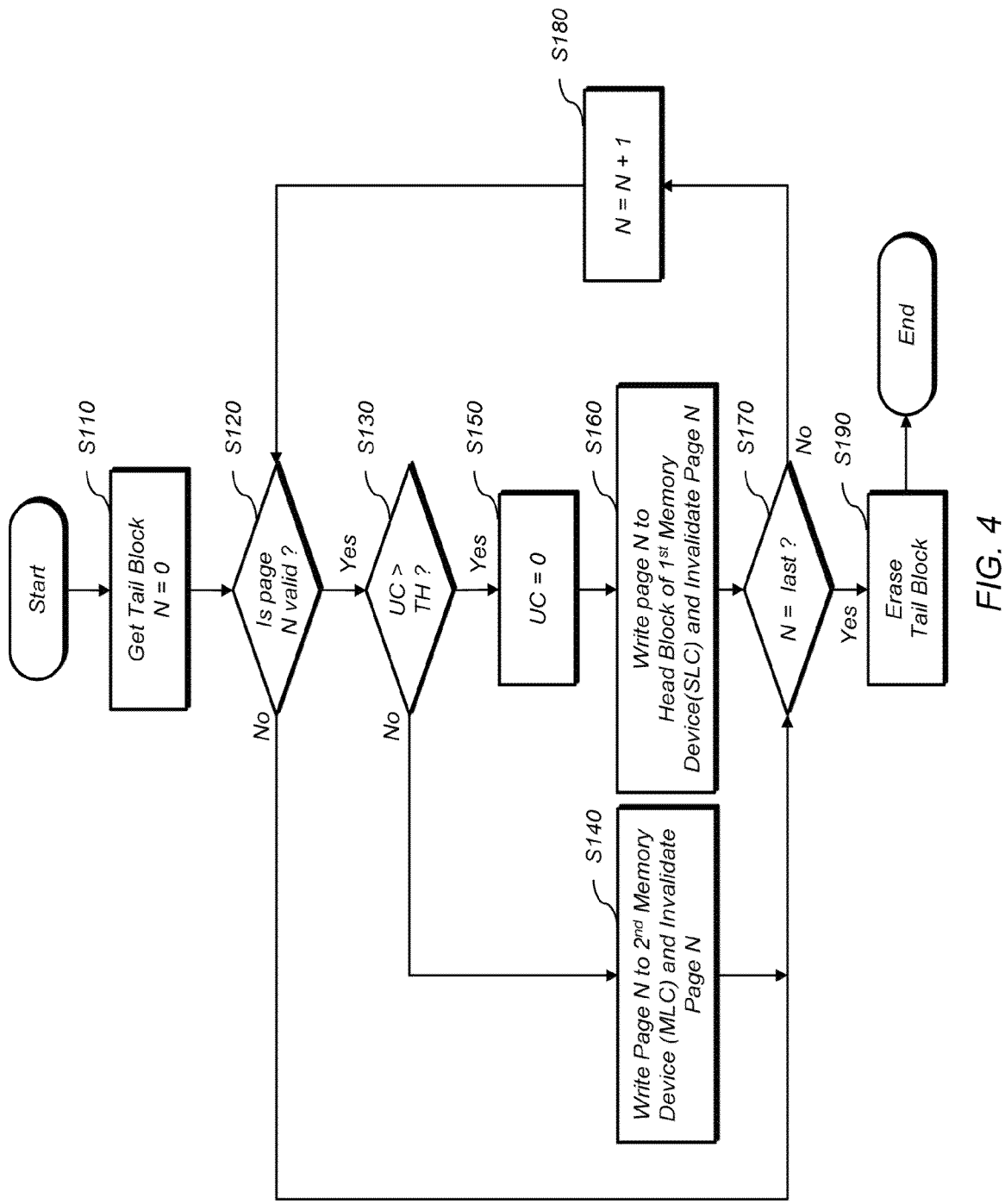
FIG. 4 is a flowchart illustrating an operating method of the first memory device according to an embodiment of the present invention.

FIG. 4 is a flowchart illustrating a garbage collection operation for the first memory device 120, which is performed by the controller 121, according to an embodiment of the present invention.

When the garbage collection operation starts, the controller 121 searches for a tail block in a block table, and designates a first page of the tail block at step S110. At this point, the first page is designated as a currently selected page.

The controller 121 determines whether or not the currently selected page is a valid page, at step S120.

When the currently selected page is not a valid page, the controller 121 moves to the next page through steps S170 and S180 as long as the currently selected page is not the last page of the tail block.

When the currently selected page contains valid data, the controller 121 determines whether or not a UC corresponding to an LPA of the currently selected page exceeds a threshold value, at step S130.

When the UC exceeds the threshold value, the controller 121 determines that the currently selected page has a relatively hot property, and resets the UC to 0 at step S150. Then, the controller 121 writes data of the currently selected page to a head block of the memory block 122 and the controller 121 invalidates the currently selected page at step S160.

When the UC does not exceed the threshold value, the controller 121 determines that the currently selected page has a relatively cold property, and transfers and writes the data of the currently selected page into the second memory device 130 and the controller 121 invalidates the currently selected page at step S140.

Then, if the currently selected page is determined to be the last page at step S170, the controller 121 erases data stored in the tail block, and changes the tail block to a free block at step S190 and ends the garbage collection operation.

If the currently selected page is not determined to be the last page at step S170, the procedure moves to step S180 to perform the garbage collection operation on the next page.

Among data determined to be hot data at the initial stage of the data write operation and stored in the first memory device 120, data whose property changes to a cold property is transferred to the second memory device 130 through the garbage collection operation.

Figure 5:
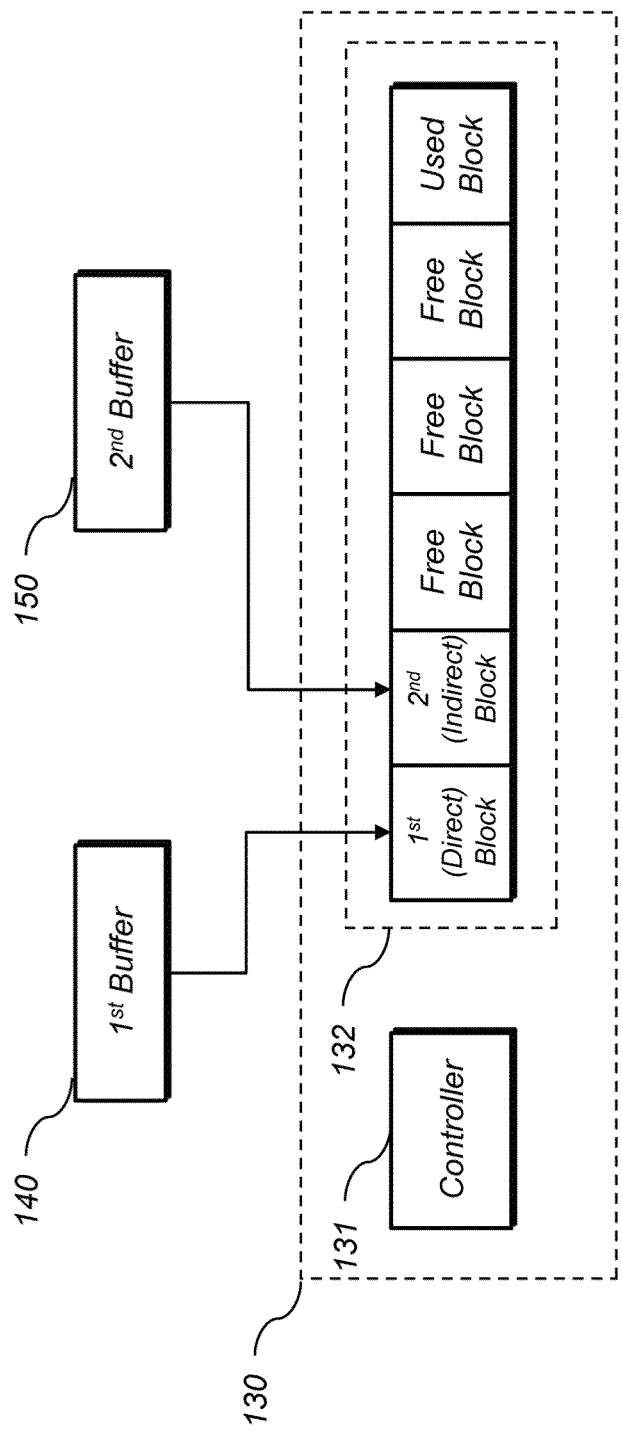
FIG. 5 is a block diagram of a second memory device according to an embodiment of the present invention.

FIG. 5 is a block diagram of the second memory device 130 according to an embodiment of the present invention.

The second memory device 130 includes a controller 131 and a memory block 132.

The controller 131 controls a data storage operation and a garbage collection operation of the second memory device 130. FIG. 5 illustrates that the controller 131 is positioned in the second memory device 130. However, in another embodiment, the controller 131 may be provided outside the second memory device 130. In still another embodiment, the controller 131 for the second memory device 130 may be integrated with the controller 121 for the first memory device 120.

In this embodiment of the present invention, it is assumed that the second memory device 130 operates according to a page level mapping method. In another embodiment, a different mapping method may be applied. In this case, the data unit may be changed accordingly.

The memory block 132 includes a plurality of blocks, and one block includes a plurality of pages. The memory block 132 includes one or more first blocks and one or more second blocks. The first block is used to store data inputted from the first buffer 140, that is, data provided from the request separator 110, and the second block is used to store data inputted from the second buffer 150, that is, data transferred from the first memory device 120.

The first and second blocks are blocks in which data may be further stored. When a first or second block is full of data while being used, one of free blocks within the second memory device 130 is selected and designated as a new first or second block.

In this embodiment, when data is written into the second memory device 130, the respective data is stored in a different block depending on where the data is transmitted from, i.e., sources of the data.

If the data is provided from the first buffer 140, it means that the data has a large length and a low access count. That is, the data has a cold property. On the other hand, if the data is provided from the second buffer 150, it means that the data has a small length or a high access count, and thus was classified into data having a hot property when it was written into the data storage device 100, but was reclassified into data having a cold property as being used.

The first and second blocks in the second memory device 130 store data having a cold property. However, as described above, the data stored in the first block and the data stored in the second block have a difference in the degree of coldness.

Figure 6:
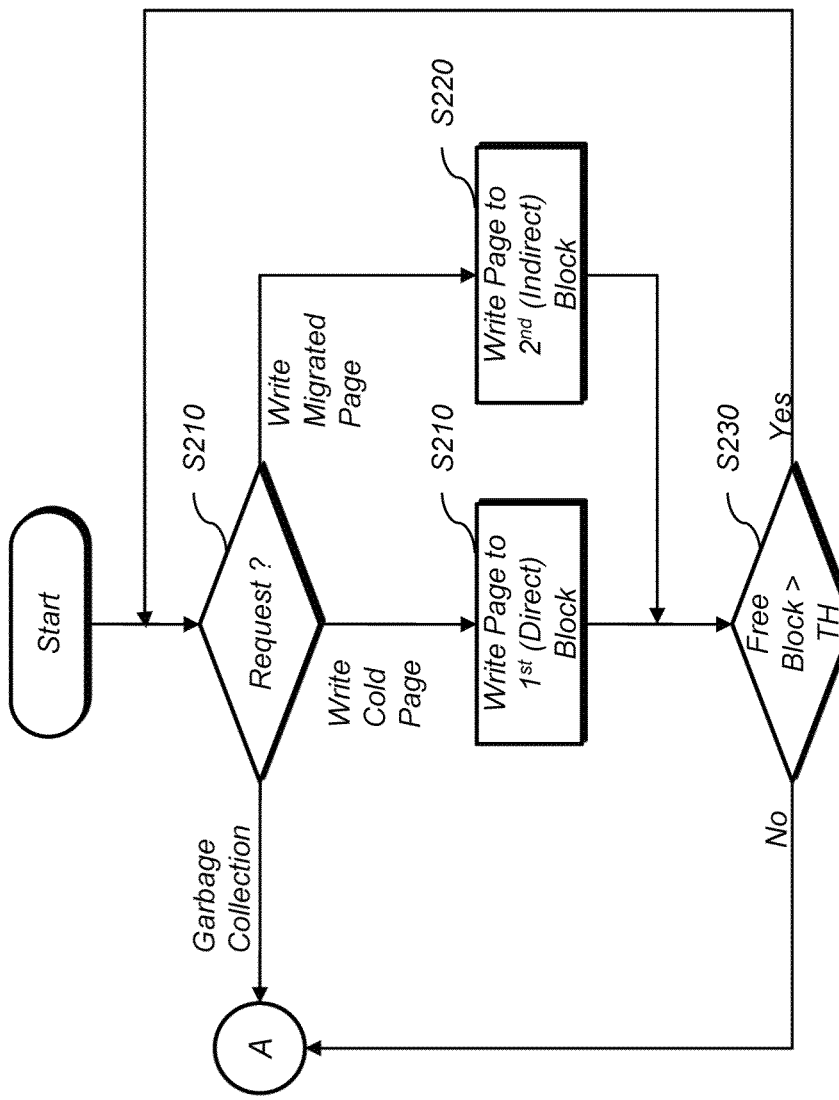
FIG. 6 is a flowchart illustrating an operating method of the second memory device according to an embodiment of the present invention.

For example, since the data written into the first block had been cold from the beginning and the data written into the second block which had been hot at the beginning was just determined to be cold, it may be said that the data in the second block has a different degree of "coldness" compared to the data in the first block. In an embodiment, such a difference in the degree of coldness may be considered to determine whether to store data in the first or second block FIG. 6 is a flowchart illustrating an operating method of the second memory device 130 according to an embodiment of the present invention.

At step S210, the second memory device 130 determines a type of a requested operation.

When a garbage collection operation is requested, the second memory device 130 performs a procedure A. The procedure A will be described later with reference to FIG. 7.

When data determined as having a cold property by the request separator 110 is to be stored, the second memory device 130 stores the data in the first block at step S210.

On the other hand, when data transferred from the first memory device 120 is to be stored, the second memory device 130 stores the data in the second block at step S220.

After data is written into the first and second blocks, the second memory device 130 may determine whether or not the number of free blocks therein exceeds a threshold value, at step S230.

When the number of free blocks exceeds the threshold value, that is, it is determined that the second memory device 130 has a sufficient available storage space, the second memory device 130 moves to an initial stage and performs step S210. If the number of free blocks is less than or equal to the threshold value, then the second memory device 130 moves to the procedure A to a perform garbage collection operation.

Figure 7:
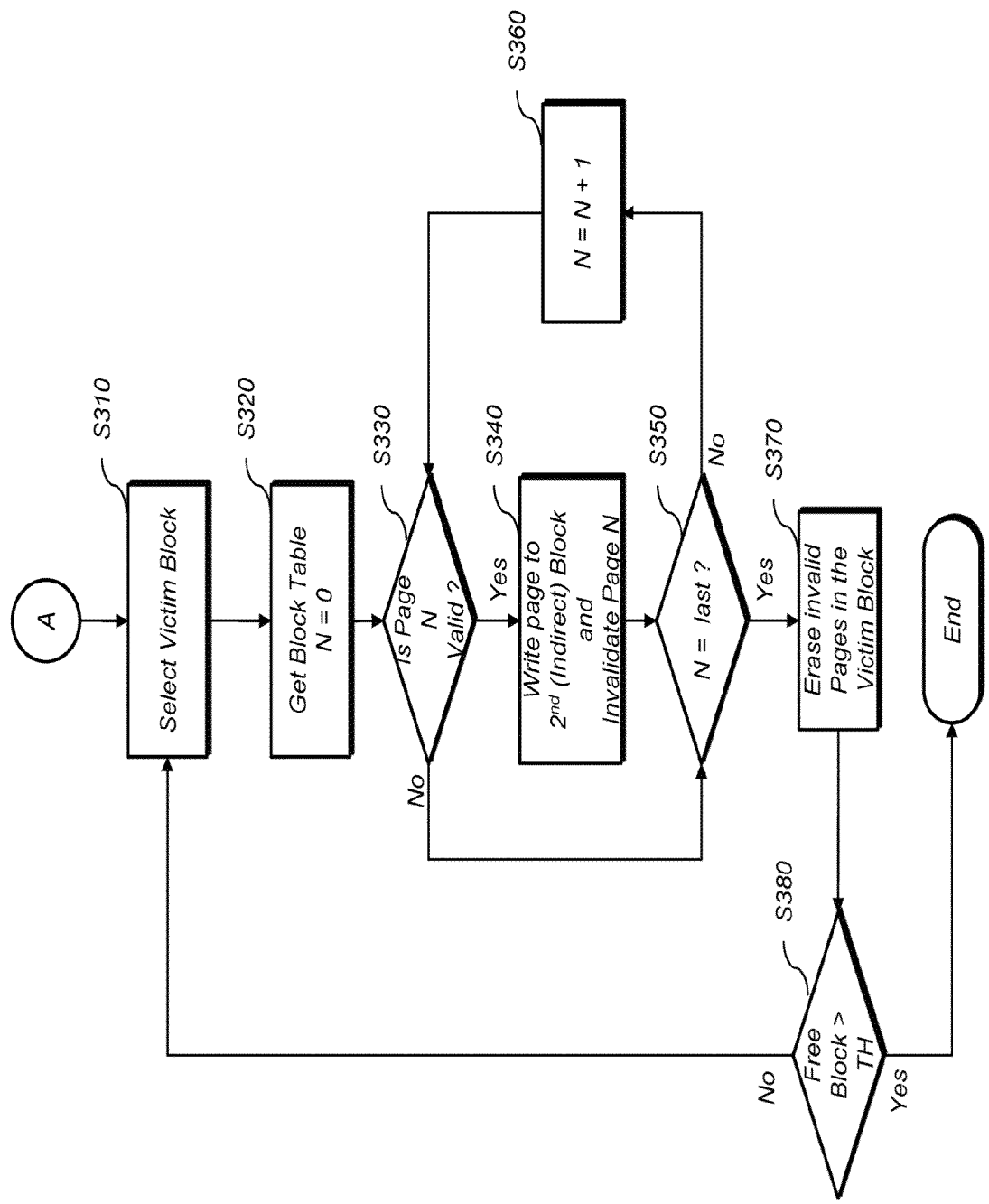
FIG. 7 is a flowchart illustrating a garbage collection operation performed in the second memory device according to an embodiment of the present invention.

FIG. 7 is a flowchart illustrating a garbage collection operation performed in the second memory device 130 according to an embodiment of the present invention.

If a garbage collection request is made, the controller 131 selects a victim block, that is, a block on which the garbage collection operation is to be performed, from among the plurality of blocks in the memory block 132 at step S310.

There are a variety of techniques for selecting a victim block. In this embodiment, a technique is applied to select the victim block that would require minimum cost to perform garbage collection. A block that had been used as the first block or a block that had been used as the second block is likely to be selected as the victim block.

When the victim block is selected, the controller 131 designates a first page (N=0) of the victim block from a block table at step S320. At this point, the first page is designated as a currently selected page.

Then, the controller 131 determines whether or not the currently selected page is valid at step S330. If the currently selected page is determined to be invalid, the controller 131 moves to the next page as long as the currently selected page is not the last page, through steps S350 and S360.

On the other hand, if the currently selected page is determined to be valid, the controller 131 transfers data of the currently selected page to the second block and then invalidates the currently selected page at step S340. Subsequently, the controller 131 determines whether or not the currently selected page is the last page at step S350. If it is determined that the currently selected page is not the last page of the victim block, the procedure moves to step S360 and the controller 131 determines at step S330 whether or not the next page is valid, the next page being newly designated as the currently selected page through step S360.

Through the above processes, if the last page is processed, i.e., the currently selected page is determined as the last page at step S350, data stored in invalid pages of the victim block are erased, and the victim block is changed to a free block at step S370

After that, the controller 131 may recheck whether or not the number of free blocks in the memory block 132 exceeds the threshold value, at step S380. As a result of the checking process at step S380, if it is determined that the number of free blocks is equal to or less than the threshold value, the controller 131 performs the garbage collection operation on another victim block according to the above-described sequence.

The reason that the data of the valid page is transferred to the second block during the garbage collection operation for the second memory device 130 is similar to the reason that data transferred from the first memory device 120 is stored in the second block.

That is, when the minimum cost technique is applied to select the victim block, it is likely that the cold property may be damaged in terms of the length of data because the victim block has a relatively low ratio of valid pages. Thus, data transferred from the victim block are stored in the second block.

FIGS. 8A to 8D are diagrams illustrating an operating method of the second memory device 130 according to an embodiment of the present invention.

Figure 8A:
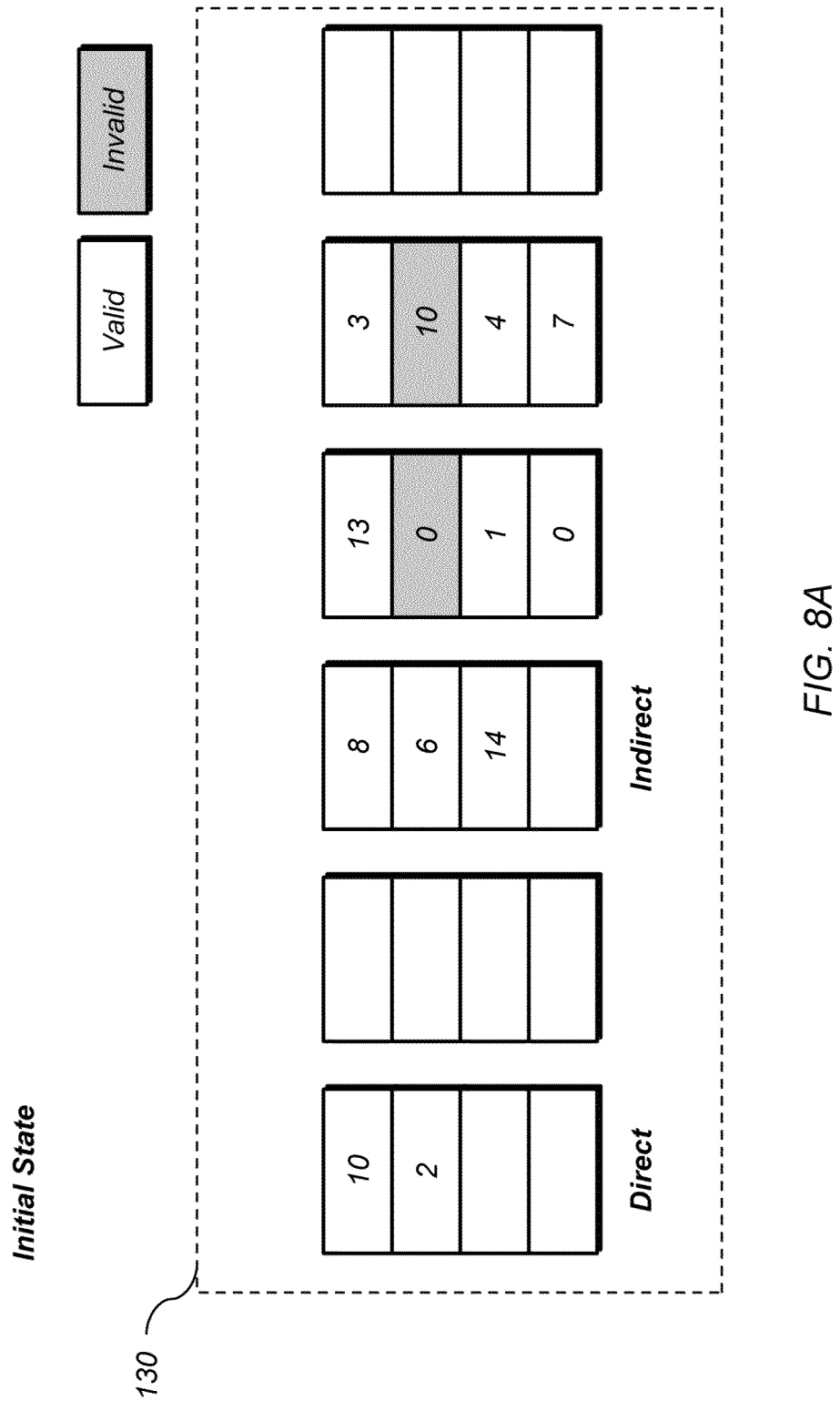
FIGS. 8A to 8D are diagrams illustrating operating methods of the second memory device according to embodiments of the present invention.

FIG. 8A illustrates an initial state of the memory block 132. In FIG. 8A, one block includes four pages. In each of the pages, a number represents an LPA.

In FIG. 8A, a gray page represents an invalid page that stores invalid data, and a white page with no number represents an empty page that stores no data. A white page with a number represents a valid page that stores valid data. A block including four empty pages is a free block.

Referring to FIG. 8A, a first block Direct and a second block Indirect are distinguished as different blocks from each other.

Figure 8B:
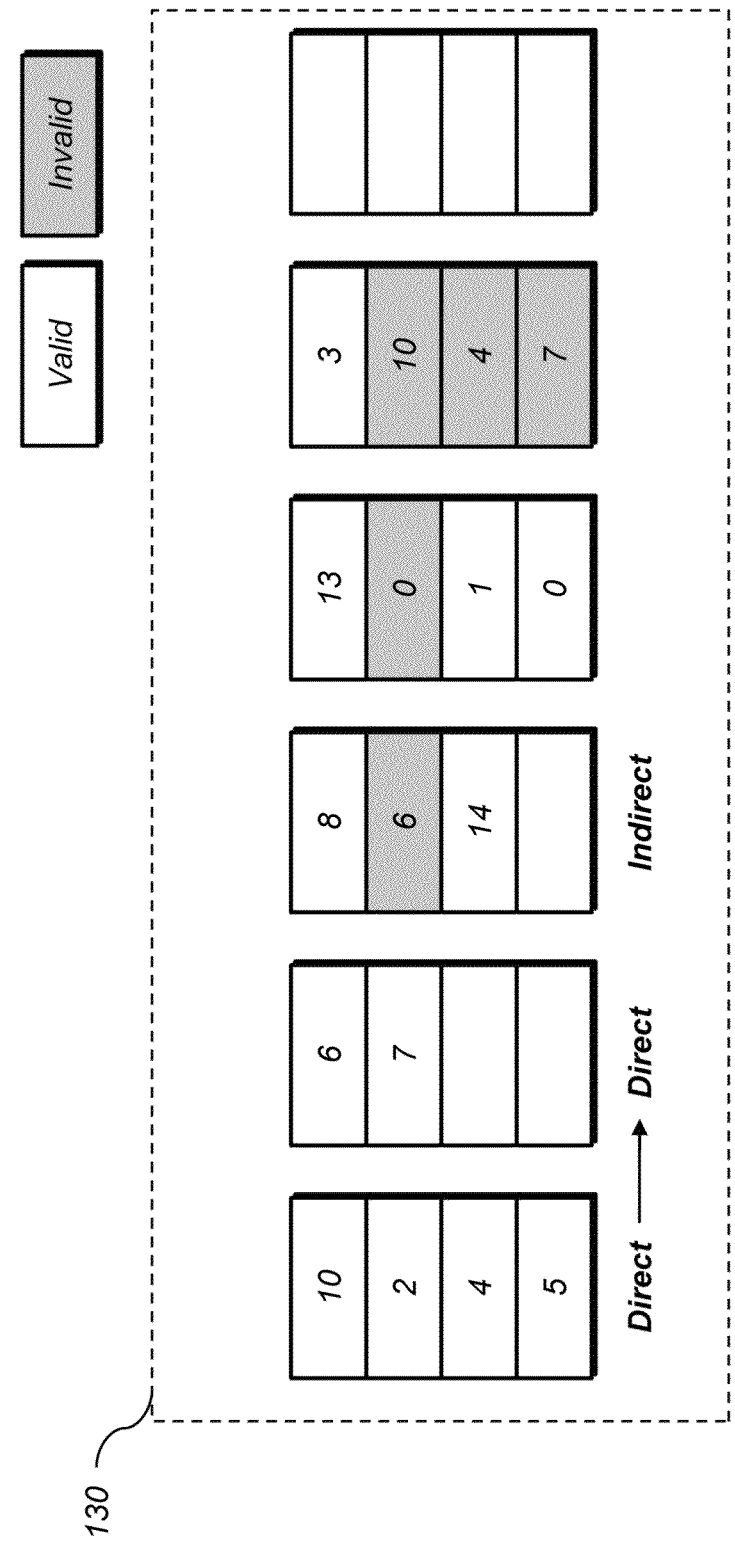

FIG. 8B illustrates an operation of storing data that is determined as cold data by the request separator 110. In FIG. 8B, data for LPAs 4, 5, 6, and 7 are stored.

As described above, such data is stored in the first block Direct. After the data for LPAs 4 and 5 is written, data cannot be written into the first block Direct any more because the first block Direct is full. Thus, one of the free blocks is designated as a new first block, and data for the LPAs 6 and 7 are written into the new first block.

Pages corresponding to the LPAs 4, 6, and 7 at which existing data have been stored are designated as invalid pages.

Figure 8C:
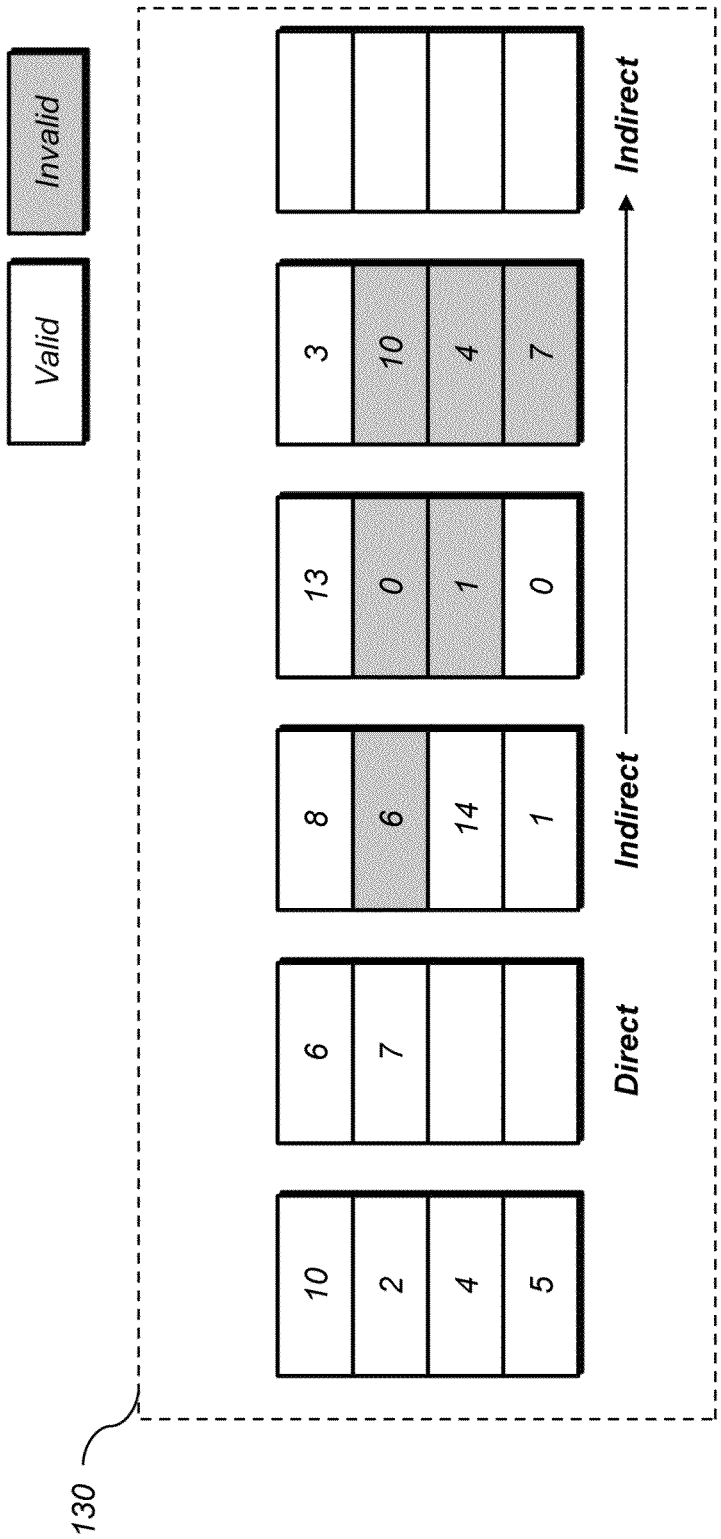

FIG. 8C illustrates an operation of storing data transferred from the first memory device 120. In FIG. 8C, data for an LPA 1, which is transferred from the first memory device 120 as described above, is stored in the second block Indirect.

After the data for the LPA 1 is written into the second block Indirect, data cannot be written into the second block any more because the second block Indirect is full. Thus, one of free blocks is designated as a new second block.

A page corresponding to the LPA 1 at which existing data has been stored is designated as an invalid page.

Figure 8D:
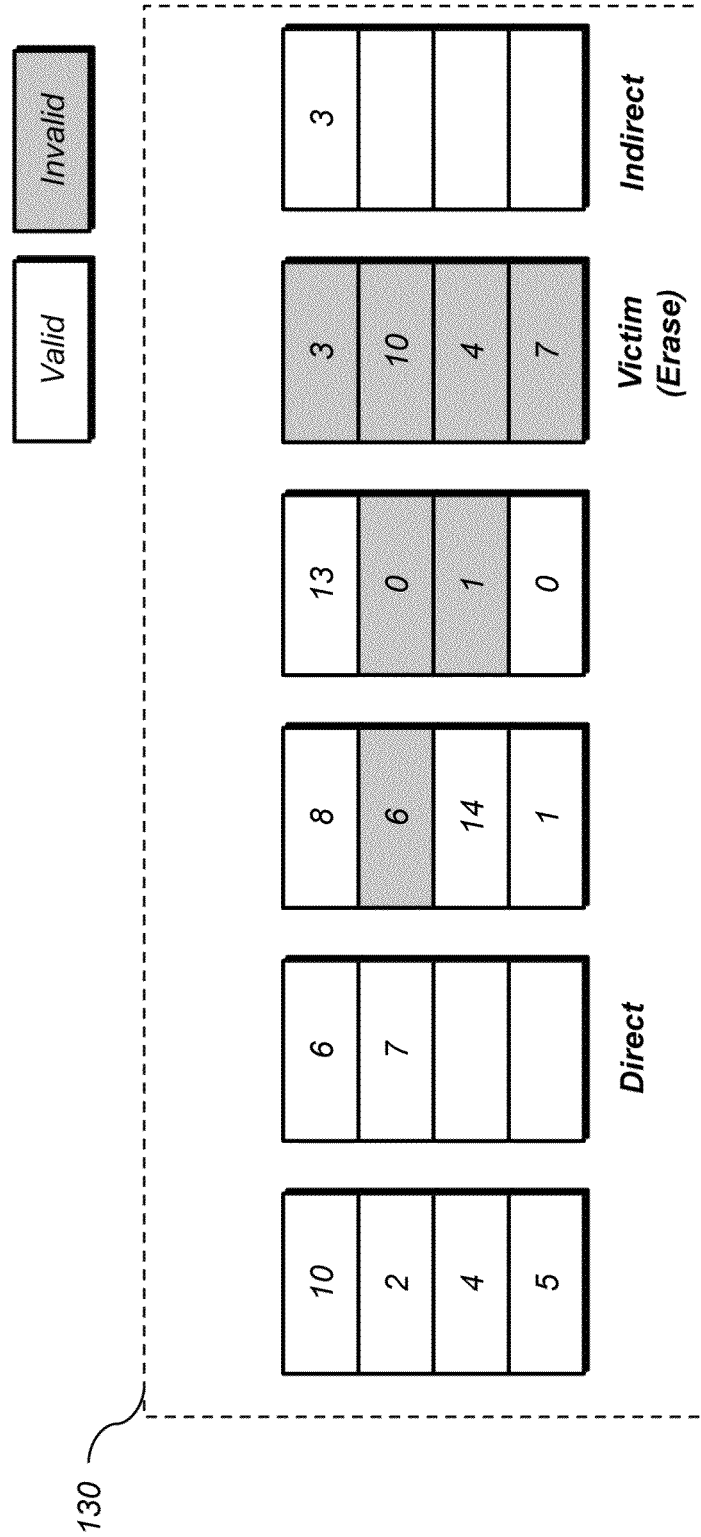

FIG. 8D illustrates a garbage collection operation performed in the second memory device 130.

In this embodiment, a block having the largest number of invalid pages is selected as the victim block. In FIG. 8C, a block that includes three invalid pages is selected as the victim block.

In the victim block, data of a valid page corresponding to an LPA 3 is transferred and stored into the second block Indirect, and then the valid page is invalidated. When the victim block is full of invalid pages, data stored in the victim block is erased, and the victim block is changed to a free block.

Figure 9:
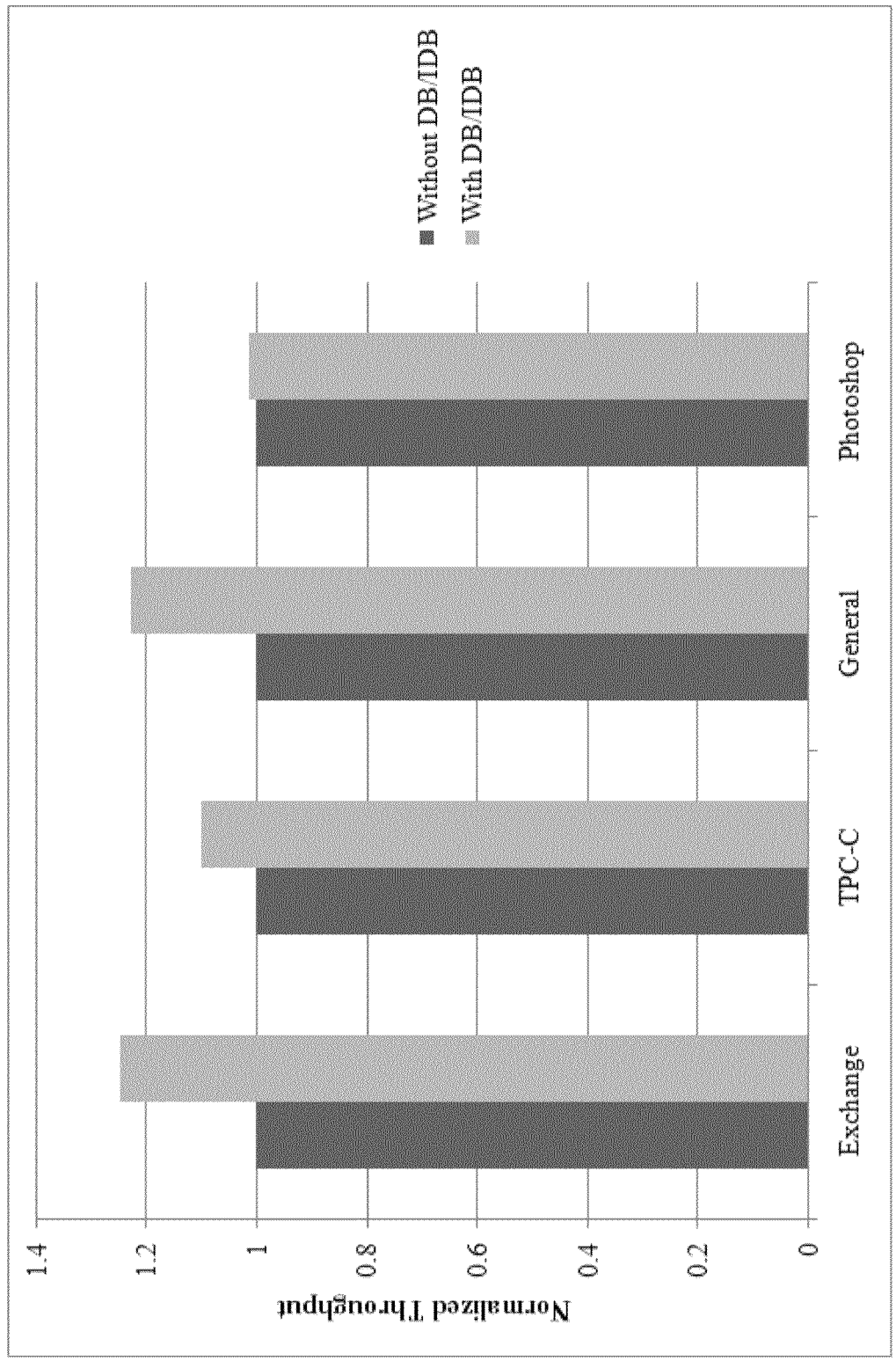
FIG. 9 is a diagram illustrating a simulation result obtained by testing the performance of a data storage device according to an embodiment of the present invention.

FIG. 9 is a diagram illustrating a simulation result obtained by testing the performance of the data storage device 100 according to an embodiment of the present invention. By going over the simulation result, an effect obtained by using the second memory device 130 may be checked.

In this test, in order to check the performance improvement obtained through the use of the second memory device 130 including the first and second blocks, data determined as hot data by the request separator 110 is not stored in the first memory device 120, but is directly stored in the second block of the second memory device 130. Furthermore, data determined as cold data by the request separator 110 is stored in the first block of the second memory device 130, and garbage-collected data in the second memory device 130 is stored in the second block of the second memory device 130.

Referring to FIG. 9, it can be seen that, when the second memory device 130 including the first and second blocks is used, which is represented by the dark colored bars, throughput of the data storage device 100 is improved compared that of a second memory device that does not include distinct or separate blocks, which is represented by the light colored bars.

In the graph, Exchange represents a test result in an environment running Microsoft Exchange Server program, TPC-C represents a test result in an environment running TPC-C benchmark, General represents a test result running a benchmark generated by the inventors mimicking normal usage of computers and Photoshop represents a test result in an environment running Adobe Photoshop program.

Although various embodiments have been described for illustrative purposes, it will be apparent to those skilled in the art that various changes and modifications may be made without departing from the spirit and scope of the invention as defined in the following claims.

In particular, the SLC flash memory device and the MLC flash memory device have been taken as examples of the first and second memory devices. However, the first and second memory devices are not limited to a flash memory device or a semiconductor memory device. It is obvious to those skilled in the art that the technical idea of the present invention may be applied to an arbitrary data storage device including a memory device having a relatively high operating speed and a memory device having a relatively large storage capacity, and the data storage device and an operating method thereof are included in the scope of the present invention.

What is claimed is:

1. A data storage device comprising:
a first memory device configured to store first data having a hot property;
a second memory device comprising a first block configured to store second data having a cold property and a second block configured to store third data transferred from the first memory device, wherein the second data and the third data are stored in different physical blocks of the second memory device; and
a request separator configured to classify data requested from outside into the first data having the hot property or the second data having the cold property, wherein the request separator comprises:
a first selection circuit configured to classify the requested data into the first data having the hot property or fourth data having the cold property according to a length of the requested data; and
a second selection circuit configured to reclassify the fourth data into fifth data having the hot property or the second data having the cold property according to a number of requests for a logical address corresponding to the requested data, the first data including the fifth data.

2. The data storage device of claim 1, wherein the second selection circuit comprises:
a storage unit configured to sequentially store logical page addresses (LPAs) of the requested data according to a request sequence; and
a selection controller configured to reclassify the fourth data into the fifth data having the hot property when the number of requests for an LPA corresponding to the fourth data is greater than a predetermined number.

3. The data storage device of claim 1, further comprising:
a first buffer configured to temporarily store the second data; and
a second buffer configured to temporarily store the third data.

4. The data storage device of claim 1, further comprising a controller configured to select one or more data stored at a certain physical location of the first memory device, and transfer the selected data to the second memory device or store the selected data at a different physical location of the first memory device according to an update count (UC) of an address at which the data are stored.

5. The data storage device of claim 4, wherein the selected data includes data that has not been used for the longest time among data stored in the first memory device.

6. The data storage device of claim 4, wherein the controller transfers data stored at the certain physical location, which has an UC equal to or less than a threshold value, to the second memory device.

7. The data storage device of claim 4, wherein the controller stores data stored at the certain physical location, which has an UC greater than a threshold value, at the different physical location of the first memory device.

8. The data storage device of claim 1, further comprising a controller configured to perform a garbage collection operation on the second memory device.

9. The data storage device of claim 8, wherein the controller stores data, which is collected in the garbage collection operation, in the second block of the second memory device.

10. The data storage device of claim 1, wherein the first memory device comprises a memory device including single-level cells, and the second memory device comprises a memory device including multi-level cells.

11. The data storage device of claim 1, wherein at least one of the first and second memory devices comprises a nonvolatile memory device.

12. An operating method of a data storage device, the operating method comprising:
storing first data having a hot property in a first memory device;
storing second data having a cold property in a first block of a second memory device;
storing third data transferred from the first memory device in a second block of the second memory device, wherein the second data and the third data are stored in different physical blocks of the second memory device; and
classifying data requested from outside into the first data having the hot property or the second data having the cold property, wherein the classifying of the requested data comprises:
a first step of classifying the requested data into the first data having the hot property or fourth data having the cold property according to a length of the requested data and
a second step of reclassifying the fourth data into fifth data having the hot property or the second data having the cold property according to a number of requests for a logical address corresponding to the requested data, the first data including the fifth data.

13. The operating method of claim 12, wherein the second step comprises:
sequentially storing logical page addresses (LPAs) of the requested data in a storage unit having a predetermined length according to a request sequence; and
reclassifying the fourth data into the fifth data having the hot property when the number of requests for an LPA corresponding to the fourth data is greater than a predetermined number.

14. The operating method of claim 12, further comprising:
selecting one or more data in the first memory device; and
transferring the selected data to the second memory device if an update count (UC) corresponding to an address of the selected data does not exceed a threshold value.

15. The operating method of claim 14, further comprising, if the UC corresponding to the address of the data exceeds the threshold value, storing the selected data in the first memory device again.

16. The operating method of claim 15, further comprising resetting the UC corresponding to the address of the selected data when the selected data is stored again in the first memory device.

17. The operating method of claim 14, further comprising, when new data is written at an address of valid data existing in the first memory device, increasing an UC corresponding to the address.

18. The operating method of claim 14, wherein the selecting of the one or more data comprises selecting one or more data including data that has not been used for the longest time in the first memory device.

19. The operating method of claim 12, further comprising performing a garbage collection operation on the second memory device.

20. The operating method of claim 19, wherein the performing of the garbage collection operation comprises storing data collected in the garbage collection operation in the second block of the second memory device.

* * * * *